United States Patent
Adimadhyam et al.

(10) Patent No.: US 12,281,381 B2
(45) Date of Patent: Apr. 22, 2025

(54) METHODS AND APPARATUS FOR PROCESSING A SUBSTRATE

(71) Applicant: Applied Materials, Inc., Santa Clara, CA (US)

(72) Inventors: Sireesh Adimadhyam, San Jose, CA (US); Shouyin Zhang, Alameda County, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 11 days.

(21) Appl. No.: 17/512,390

(22) Filed: Oct. 27, 2021

(65) Prior Publication Data

US 2023/0130106 A1    Apr. 27, 2023

(51) Int. Cl.
| | | |
|---|---|---|
| *C23C 14/34* | (2006.01) | |
| *C23C 14/54* | (2006.01) | |
| *H01J 37/34* | (2006.01) | |

(52) U.S. Cl.
CPC .......... *C23C 14/3485* (2013.01); *C23C 14/54* (2013.01); *H01J 37/3467* (2013.01); *H01J 2237/24564* (2013.01); *H01J 2237/332* (2013.01)

(58) Field of Classification Search
CPC .. C23C 14/3485; C23C 14/54; H01J 37/3467; H01J 2237/24564; H01J 2237/332
See application file for complete search history.

(56) References Cited

U.S. PATENT DOCUMENTS

| | | | | |
|---|---|---|---|---|
| 5,518,593 A | * | 5/1996 | Hosokawa | .......... C23C 14/3407 118/724 |
| 5,584,974 A | * | 12/1996 | Sellers | ................ H01J 37/3444 204/192.12 |
| 6,416,638 B1 | * | 7/2002 | Kuriyama | ............... C23C 14/54 204/298.03 |
| 6,967,305 B2 | | 11/2005 | Sellers | |
| 8,837,097 B2 | | 9/2014 | Zuercher et al. | |

(Continued)

FOREIGN PATENT DOCUMENTS

| | | |
|---|---|---|
| JP | 2003268541 A | 9/2003 |
| JP | 2004006147 A | 1/2004 |
| JP | WO2012023276 A1 | 10/2013 |

OTHER PUBLICATIONS

PCT International Search Report and Written Opinion for PCT/US2022/036072 dated Oct. 28, 2022.

*Primary Examiner* — James Lin
*Assistant Examiner* — Patrick S Ott
(74) *Attorney, Agent, or Firm* — MOSER TABOA

(57) ABSTRACT

Methods and apparatus for processing a substrate are provided herein. For example, a method for processing a substrate comprises supplying pulsed DC power to a target disposed in a processing volume of a processing chamber for depositing sputter material onto a substrate, during a pulse off time, determining if a reverse current is equal to or greater than at least one of a first threshold or a second threshold different from the first threshold, and if the reverse current is equal to or greater than the at least one of the first threshold or second threshold, generate a pulsed DC power shutdown response, and if the reverse current is not equal to or greater than the at least one of the first threshold or second threshold, continue supplying pulsed DC power to the target.

20 Claims, 3 Drawing Sheets

(56) References Cited

U.S. PATENT DOCUMENTS

| | | |
|---|---|---|
| 2003/0205460 A1 | 11/2003 | Buda |
| 2007/0037300 A1* | 2/2007 | Qin .................. G01N 21/73 |
| | | 438/14 |
| 2008/0121517 A1* | 5/2008 | Nitschke .......... H01J 37/32623 |
| | | 204/298.03 |
| 2010/0012482 A1 | 1/2010 | Klein et al. |
| 2011/0279121 A1 | 11/2011 | Winterhalter et al. |
| 2016/0118233 A1* | 4/2016 | Stowell, Jr. ......... H01J 37/3444 |
| | | 204/192.12 |

* cited by examiner

METHODS AND APPARATUS FOR PROCESSING A SUBSTRATE

FIELD

Embodiments of the present disclosure generally relate to methods and apparatus for processing a substrate. For example, methods and apparatus that use arc detection during substrate processing are herein described.

BACKGROUND

Current methods and apparatus for arc detection during processing use current, voltage, and/or change of current (Δ current) or voltage (Δ voltage) sensor data during a pulse on time of a power supply (DC power supply). Such methods and apparatus, however, can fail to detect up to 16% of arcs because the arcs do not meet criteria (e.g., thresholds) of the power supply or cannot be recognized within a physical response time of the power supply.

For example, fast developing arcs during pulse on time can be difficult to detect as the arc might not meet the criteria due to a short duration of the arc, or arc current and/or arc voltage may not meet a threshold of arc current and/or voltage (or a differential thereof) during processing due to hardware/firmware limitations of arc detection mechanisms used during processing.

SUMMARY

Methods and apparatus for processing a substrate are provided herein. In some embodiments, a method for processing a substrate includes supplying pulsed DC power to a target disposed in a processing volume of a processing chamber for depositing sputter material onto a substrate, during a pulse off time, determining if a reverse current is equal to or greater than at least one of a first threshold or a second threshold different from the first threshold, and if the reverse current is equal to or greater than the at least one of the first threshold or second threshold, generate a pulsed DC power shutdown response, and if the reverse current is not equal to or greater than the at least one of the first threshold or second threshold, continue supplying pulsed DC power to the target.

In accordance with at least some embodiments, a non-transitory computer readable storage medium having stored thereon instructions that when executed by a processor performs a method for processing a substrate. The method includes supplying pulsed DC power to a target disposed in a processing volume of a processing chamber for depositing sputter material onto a substrate, during a pulse off time, determining if a reverse current is equal to or greater than at least one of a first threshold or a second threshold different from the first threshold, and if the reverse current is equal to or greater than the at least one of the first threshold or second threshold, generate a pulsed DC power shutdown response, and if the reverse current is not equal to or greater than the at least one of the first threshold or second threshold, continue supplying pulsed DC power to the target.

In accordance with at least some embodiments, a system includes a substrate processing chamber, a pulsed DC power source, a sensor configured to measure a reverse current during operation, and controller configured to receive data from the sensor, supply pulsed DC power to a target disposed in a processing volume of the substrate processing chamber for depositing sputter material onto a substrate, during a pulse off time, determine if the reverse current is equal to or greater than at least one of a first threshold or a second threshold different from the first threshold, and if the reverse current is equal to or greater than the at least one of the first threshold or second threshold, generate a pulsed DC power shutdown response, and if the reverse current is not equal to or greater than the at least one of the first threshold or second threshold, continue supplying pulsed DC power to the target.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
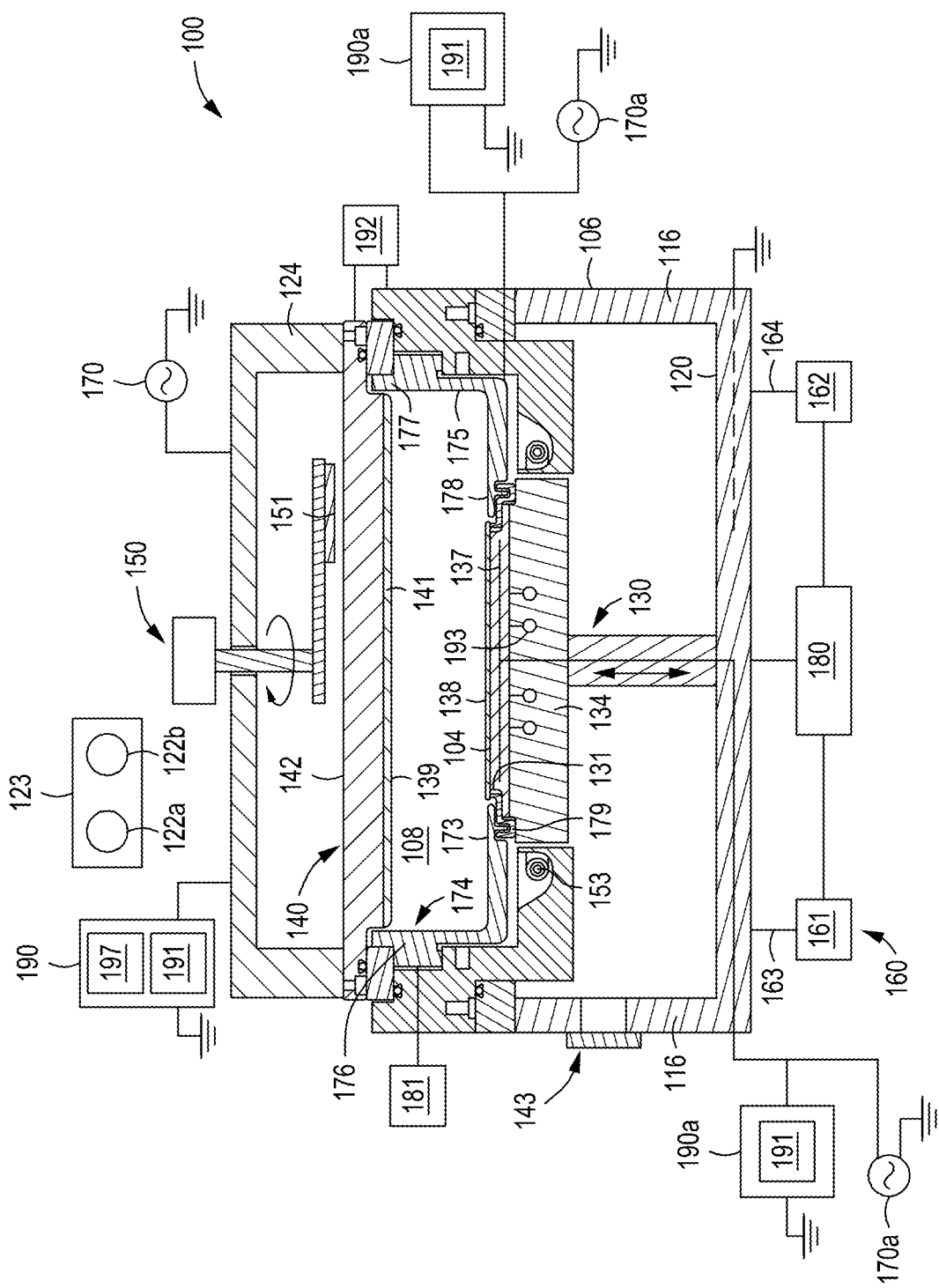
FIG. 1 depicts a schematic side view of a processing chamber, in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for processing a substrate are provided herein. For example, in at least some embodiments, the methods and apparatus address under reporting of arc events (e.g., escaped arcs) and consequently untreated arc events during processing. For example, in at least some embodiments, methods can comprise supplying pulsed DC power to a target disposed in a processing volume of a processing chamber for depositing sputter material onto a substrate. During a pulse off time, the method comprises determining if a reverse current is equal to or greater than at least one of a first threshold or a second threshold different from the first threshold. If the reverse current is equal to or greater than the at least one of the first threshold or second threshold, the method comprises generating a pulsed DC power shutdown response, and if the reverse current is not equal to or greater than the at least one of the first threshold or second threshold, the method comprises continue supplying pulsed DC power to the target. The methods and apparatus described herein boosts total arc detectability from about 87% to about 99% during processing.

FIG. 1 depicts a schematic side view of a processing chamber 100 (e.g., a PVD chamber), in accordance with at least some embodiments of the present disclosure. Examples of PVD chambers suitable for use with the present disclosure are commercially available from Applied Materials, Inc., of Santa Clara, California Other processing chambers from Applied Materials, Inc. or other manufacturers may also benefit from the inventive apparatus disclosed herein.

The processing chamber 100 comprises chamber walls 106 that enclose an inner volume 108 (process volume/cavity). The chamber walls 106 include sidewalls 116 and a bottom wall 120. The processing chamber 100 can be a standalone chamber or a part of a multi-chamber platform (not shown) having a cluster of interconnected chambers connected by a substrate transfer mechanism that transfers substrates between the various chambers. The processing chamber 100 may be a PVD chamber capable of sputter depositing material onto a substrate 104, as described in greater detail below. Non-limiting examples of suitable materials for sputter deposition include one or more of carbon (C), silicon (Si), silicon nitride (SiN), aluminum (Al), tungsten (W), tungsten carbide (WC), copper (Cu), titanium (Ti), titanium nitride (TiN), titanium carbide (TiC), carbon nitride (CN), or the like.

The processing chamber 100 comprises a substrate support 130 which comprises a pedestal 134 to support the substrate 104. The substrate support surface 138 of the pedestal 134 receives and supports the substrate 104 during processing. The pedestal 134 may include an electrostatic chuck or a heater (such as an electrical resistance heater, heat exchanger, or other suitable heating device). The substrate 104 can be introduced into the processing chamber 100 through a substrate loading inlet 143 in the sidewall 116 of the processing chamber 100 and placed onto the substrate support 130. The substrate support 130 can be lifted or lowered by a support lift mechanism, and a lift finger assembly can be used to lift and lower the substrate 104 onto the substrate support 130 during placement of the substrate 104 on the substrate support 130 by a robot arm. The pedestal 134 is biasable and can be maintained at an electrically floating potential or grounded during plasma operation. For example, in some embodiments, the pedestal 134 may be biased to a given potential such that during a deposition a power supply (e.g., an RF power source 170 or a pulsed DC power source 190) can be used to ignite one or more gases (e.g., a process gas) to create a plasma including ions and radicals that can used to deposit sputter material onto the substrate.

The pedestal 134 has a substrate support surface 138 having a plane substantially parallel to a sputtering surface 139 of a sputtering target 140. The sputtering target 140 comprises a sputtering plate 141 mounted to a backing plate 142, which can be thermally conductive, using one or more suitable mounting devices, e.g., a solder bond. The sputtering plate 141 comprises a material to be sputtered onto the substrate 104. The backing plate 142 is made from a metal, such as, for example, stainless steel, aluminum, copper-chromium or copper-zinc. The backing plate 142 can be made from a material having a thermal conductivity that is sufficiently high to dissipate the heat generated in the sputtering target 140, which is formed in the sputtering plate 141 and the backing plate 142. The heat is generated from the eddy currents that arise in the sputtering plate 141 and the backing plate 142 and also from the bombardment of energetic ions from the plasma onto the sputtering surface 139 of the sputtering target 140. The backing plate 142 allows dissipation of the heat generated in the sputtering target 140 to the surrounding structures or to a heat exchanger which may be mounted behind the backing plate 142 or disposed within the backing plate 142. For example, the backing plate 142 can comprise channels (not shown) to circulate a heat transfer fluid therein. A suitably high thermal conductivity of the backing plate 142 is at least about 200 W/mK, for example, from about 220 to about 400 W/mK. Such a thermal conductivity level allows the sputtering target 140 to be operated for longer process time periods by dissipating the heat generated in the sputtering target 140 more efficiently, and also allows for relatively rapid cooling of the sputtering plate 141.

In some embodiments, the processing chamber 100 may include a magnetic field generator 150 to shape a magnetic field about the sputtering target 140 to improve sputtering of the sputtering target 140. The capacitively generated plasma may be enhanced by the magnetic field generator 150 in which, for example, a plurality of magnets 151 (e.g., permanent magnet or electromagnetic coils) may provide a magnetic field in the processing chamber 100 that has a rotating magnetic field having a rotational axis that is perpendicular to the plane of the substrate 104. The processing chamber 100 may, in addition or alternatively, comprise a magnetic field generator 150 that generates a magnetic field near the sputtering target 140 of the processing chamber 100 to increase an ion density in a high-density plasma region adjacent to the sputtering target 140 to improve the sputtering of the target material.

A sputtering gas is introduced into the processing chamber 100 through a gas delivery system 160, which provides gas from a gas supply 161 via conduits 163 having gas flow control valves (not shown), such as a mass flow controllers, to pass a set flow rate of the gas therethrough. The sputtering gas may comprise a non-reactive gas, such as argon or xenon, which is capable of energetically impinging upon and sputtering material from the sputtering target 140. The process gas may also comprise a reactive gas, such as one or more of an oxygen-containing gas ($O_2$) and a nitrogen-containing gas ($N_2$), that can react with the sputtered material to form a layer on the substrate 104. The gas is then energized by an RF power source 170 to form or create a plasma to sputter the sputtering target 140. For example, the process gases become ionized by high energy electrons and the ionized gases are attracted to the sputtering material, which is biased at a negative voltage (e.g., −300 to −1500 volts). The energy imparted to an ionized gas (e.g., now positively charged gas atoms) by the electric potential of the cathode causes sputtering. In some embodiments, the reactive gases can directly react with the sputtering target 140 to create compounds and then be subsequently sputtered from the sputtering target 140. For example, the cathode can be energized by both the pulsed DC power source 190 and the RF power source. In some embodiments, the pulsed DC power source 190 can be configured to provide pulsed DC to power the cathode during deposition. Spent process gas and byproducts are exhausted from the processing chamber 100 through an exhaust 162. The exhaust 162 comprises an exhaust port (not shown) that receives spent process gas and passes the spent gas to an exhaust conduit 164 having a throttle valve to control the pressure of the gas in the processing chamber 100. The exhaust conduit 164 is connected to one or more exhaust pumps (not shown).

Alternatively or additionally, the gas delivery system 160 can be coupled to a remote plasma source (not shown) that is configured to provide radicals (or plasma depending on the configuration of the remote plasma source) into the inner volume 108 of the processing chamber 100.

In at least some embodiments, the sputtering target 140 is connected to one or both of the pulsed DC power source 190 and/or the RF power source 170. The pulsed DC power source 190 can apply a bias voltage to the sputtering target 140 relative to a shield of the process kit, which may be electrically floating during a sputtering process and/or the cleaning process. The pulsed DC power source 190, or a pulsed DC power source 190a, can also be used to apply a bias voltage to a cover ring section or a heater of an adapter section of a process kit, e.g., when performing a cleaning process of a shield.

While the pulsed DC power source 190 supplies power to the sputtering target 140 and other chamber components connected to the pulsed DC power source 190, the RF power source 170 energizes the sputtering gas to form a plasma of the sputtering gas. The plasma formed impinges upon and bombards the sputtering surface 139 of the sputtering target 140 to sputter material off the sputtering surface 139 onto the substrate 104. In some embodiments, RF energy supplied by the RF power source 170 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (e.g., two or more) to provide RF energy in a plurality of the above frequencies. An additional RF power source can also be used to supply a bias voltage to the pedestal 134 and/or a cover ring section, e.g., when performing a cleaning process of the area on and around a process kit. For example, in some embodiments an RF power source 170a can be used to energize a biasable electrode 137 that can be embedded in the pedestal 134 (or the substrate support surface 138 of the substrate support 130). The biasable electrode can be used to supply power to a shield and/or the substrate support 130. Moreover, in some embodiments, the RF power source 170 can be configured to energize the biasable electrode 137. For example, one or more additional components e.g., a switching circuit can be provided to switch the electrical path from the cover or lid 124 to the biasable electrode 137.

An RF filter 191 can be connected between the pulsed DC power source 190 (or the pulsed DC power sources 190a) and the RF power source 170 (or the RF power source 170a). For example, in at least some embodiments, the RF filter can be a component of the circuitry of the pulsed DC power source 190 to block RF signals from entering the DC circuitry of the pulsed DC power source 190 when the RF power source 170 is running, e.g., when performing a deposition process.

One or more sensors can be connected to or part of the pulsed DC power source 190. For example, a sensor 197 can be a part of the pulsed DC power source 190 and can be configured to detect/measure at least one of voltage, current, or a differential of voltage or current during a pulse on time, as described in greater detail below.

Various components of the processing chamber 100 may be controlled by a controller 180 (processor or system controller) during processing. The controller 180 comprises a central processing unit 194, a memory 195 (e.g., non-transitory computer readable storage medium), and support circuits 196 for the central processing unit 194 and facilitates control of the components of the processing chamber 100. The controller 180 may be one of any form of general-purpose computer processor that can be used in an industrial setting for controlling various chambers and sub-processors. The memory 195 stores software (source or object code) that may be executed or invoked to control the operation of the processing chamber 100 in the manner described herein.

The controller 180 comprises program code (e.g., stored in a non-transitory computer readable storage medium (memory)) having instructions to operate the components to process the substrate 104. For example, the controller 180 can comprise program code that includes process monitoring instruction sets to: supply pulsed DC power to a target disposed in a processing volume of the substrate processing chamber for depositing sputter material onto a substrate; during a pulse off time, determine if the reverse current is equal to or greater than at least one of a first threshold or a second threshold different from the first threshold; if the reverse current is equal to or greater than the at least one of the first threshold or second threshold, generate a pulsed DC power shutdown response, and if the reverse current is not equal to or greater than the at least one of the first threshold or second threshold, continue supplying pulsed DC power to the target, as described in greater detail below.

Additionally, in at least some embodiments, the controller 180 can comprise program code that includes substrate positioning instruction sets to operate the substrate support 130 and substrate transfer mechanism; temperature control of one or more heating components (e.g., a lamp, radiative heating, and/or embedded resistive heaters) of a heater; cleaning process instruction sets to an area on and around a process kit; gas flow control instruction sets to operate gas flow control valves to set a flow of sputtering gas to the processing chamber 100; gas pressure control instruction sets to operate the exhaust throttle valve to maintain a pressure (e.g., about 120 sccm) in the processing chamber 100; gas energizer control instruction sets to operate the RF power source 170 to set a gas energizing power level; and temperature control instruction sets to control a temperature control system in the substrate support 130 or a heat transfer medium supply to control a flowrate of the heat transfer medium to the annular heat transfer channel.

The process kit 174 comprises various components including an adapter section 176 supported on walls of the processing chamber and having a resting surface to support a shield 175, which can be easily removed from the processing chamber 100, for example, to replace or repair eroded components, or to adapt the processing chamber 100 for other processes. The shield 175 includes a cylindrical body having a diameter sized to encircle the sputtering surface 139 of the sputtering target 140 and the substrate support 130 (e.g., a diameter larger than the sputtering surface 139 and larger than the support surface of the substrate support 130). The cylindrical body has an upper portion 177 configured to surround the outer edge of the sputtering surface 139 of the sputtering target 140 when installed in the processing chamber 100. The shield 175 further includes a lower portion 178 configured to surround the substrate support surface 138 of the substrate support 130 when installed in the processing chamber 100. The lower portion 178 includes a cover ring section 173 for placement about a peripheral wall 131 of the substrate support 130. The cover ring section 173 encircles and at least partially covers a deposition ring 179 disposed about the substrate support 130 to receive, and thus, shadow the deposition ring 179 from the bulk of the sputtering deposits. In at least some embodiments, in addition to the RF power source 170 biasing the sputtering plate 141 to perform an etch process when the area on and around the process kit 174 needs to be cleaned, the cover ring section 173 of the lower portion 178 can also be biased using the pulsed DC power source 190a and/or the RF power source 170a to facilitate cleaning the cover ring section 173.

A lower portion of the process kit 174 is configured to house a heater, e.g., one or more suitable heating components including, but not limited to, a lamp, radiative heating, or embedded resistive heaters of the heater. In the illustrated embodiment, a radiative annular coil 153, which is surrounded by a lamp envelope, e.g., glass, quartz or other suitable material (not shown). The radiative annular coil 153 can be energized or powered using, for example, the pulsed DC power source 190 or the pulsed DC power source 190a, which can be controlled by the controller 180, to reach temperatures of about 250° C. to about 300° C. when the area on and around the process kit 174 needs to be cleaned.

Figure 2:
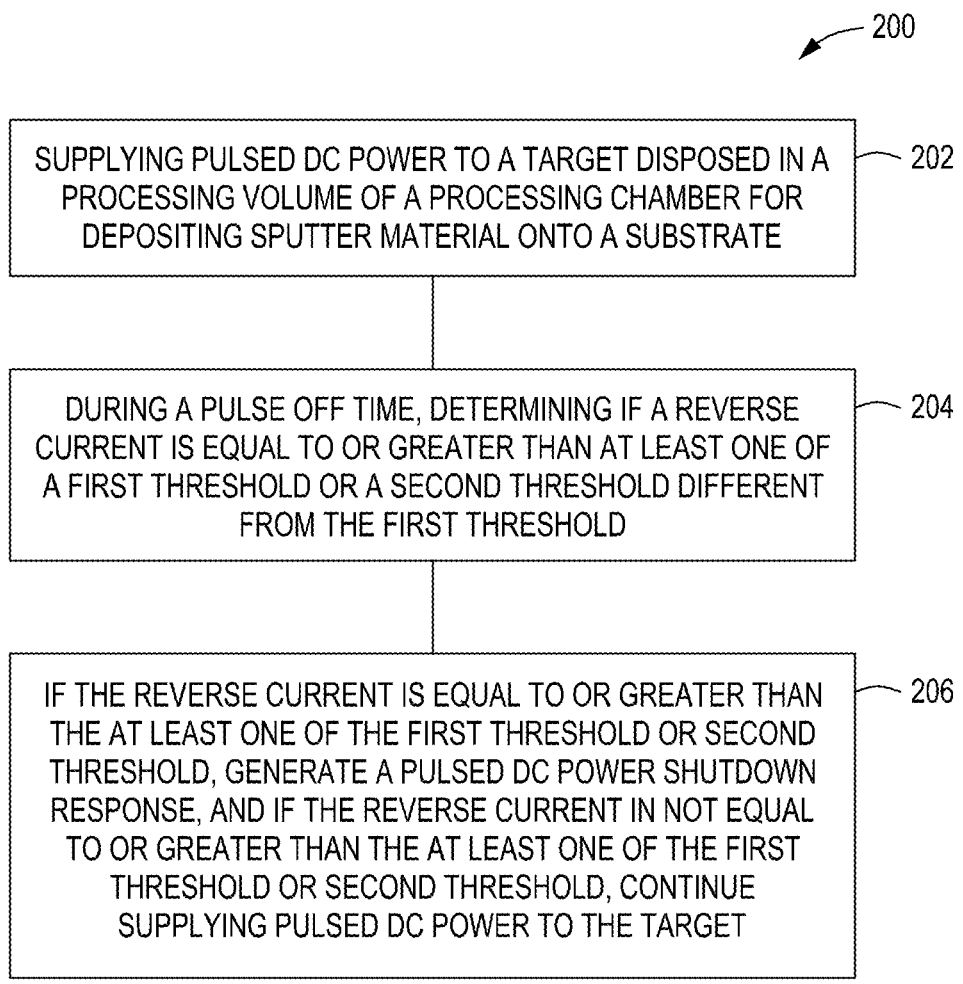
FIG. 2 is a flowchart of a method for processing a substrate, in accordance with some embodiments of the present disclosure.
Figure 3:
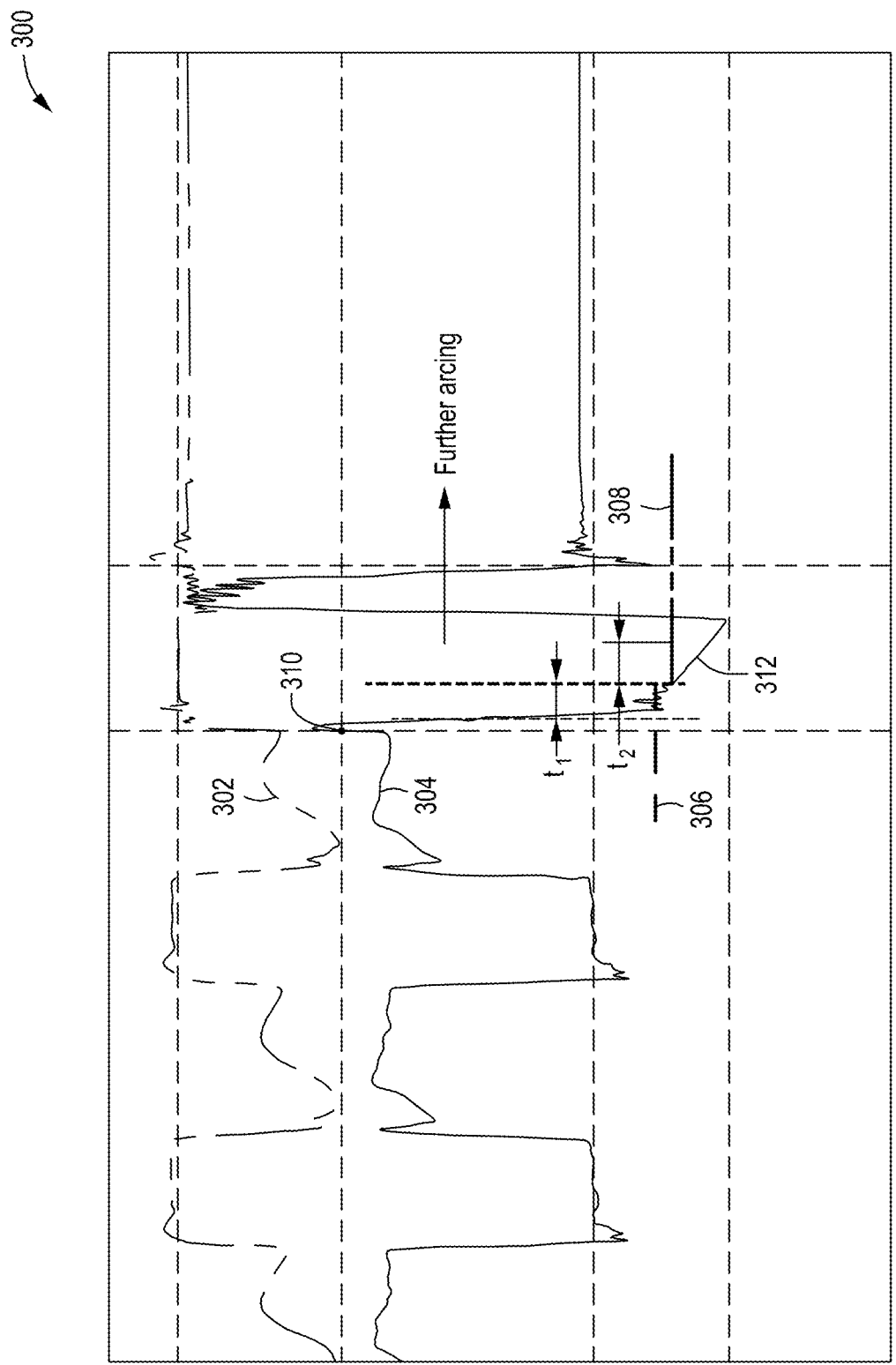
FIG. 3 is a diagram of a simulation of voltage and current waveforms during processing, in accordance with some embodiments of the present disclosure.

FIG. 2 is a flowchart of a method 200 for processing a substrate (e.g., the substrate 104), and FIG. 3 is a diagram 300 of a simulation of voltage and current waveforms during processing. For example, during a deposition process (e.g., PVD), undetected arcs (e.g., escaped arcs) have significant current signatures during a pulse off (with or without reverse voltage). Accordingly, the inventors have found that current peak signatures during the pulse off time (with or without a reverse voltage) can be used to recognize undetected arcs. Additionally, the inventors have found that a second type of event with sustained high current (e.g., current excursions) also occurs during the pulse off time (e.g., under certain reverse voltage conditions), which can lead to more arcing.

Thus, in at least some embodiments, multiple reverse current thresholds are used during a pulse off time to record and provide a pulsed dc generator power shutdown response. For example, in at least some embodiments, the thresholds help treat unreported fast developing arcs and handle sustained high current excursions that can occur during processing.

For example, at 202, the method 200 comprises supplying pulsed DC power to a target disposed in a processing volume of a processing chamber (e.g., a physical vapor deposition chamber) for depositing sputter material onto a substrate. For example, the pulsed DC power source 190 can provide pulsed DC power to the sputtering target 140 (see voltage at on time 302 and current at on time 304 of FIG. 3). In at least some embodiments, the voltage can be about 0 to −2.5 kV and the current can be about 0 to 1000 A. Additionally, in at least some embodiments, the substrate can comprise an epoxy substrate, a glass substrate, or a silicon substrate. In at least some embodiments, the substrate is a silicon substrate and has a node size of 7 nm or less.

Next, at 204, the method 200 comprises during a pulse off time, determining if a reverse current (or reverse voltage (for charge scrubbing to quench the arc sooner) or combination of reverse voltage and reverse current) is equal to or greater than at least one of a first threshold or a second threshold different from the first threshold. For example, at 204, the sensor 197 can detect a reverse current and transmits a signal representative of the detected reverse current to the controller 180. The controller 180 compares the reverse current with a first threshold 306 ($t_1$) and a second threshold 308 ($t_2$), each of which can be determined based on a particular duration for triggering a response. In at least some embodiments, the particular duration for triggering the response can be adjustable from about 0 to a duration of the reverse pulse, which can be 1 µs. The first threshold 306, which is present during a pulse off time, corresponds to an arc occurrence 310 during a pulse on time. In at least some embodiments, the first threshold 306 detects arcs that do not meet criteria of at least one of voltage, current, or a differential of voltage or current during a pulse on time (e.g., due to hardware/firmware limitations of arc detection mechanisms used during processing). Similarly, in at least some embodiments, the second threshold 308 corresponds to current excursions 312 during the pulse off time.

Next, at 206, the method 200 comprises if the reverse current is equal to or greater than the at least one of the first threshold or second threshold, generate a pulsed DC power shutdown response, and if the reverse current is not equal to or greater than the at least one of the first threshold or second threshold, continue supplying pulsed DC power to the target. For example, at 206, if the controller 180 determines that the reverse current is equal to or greater than first threshold 306 or second threshold 308, the controller 180 generates the pulsed DC power shutdown response, e.g., pulsed DC power is temporarily halted to the target. Conversely, if the controller 180 determines that the reverse current is not equal to or greater than first threshold 306 or second threshold 308, the controller 180 continues supplying pulsed DC power to the target.

In at least some embodiments, the method 200 can comprise using one of the first threshold or the second threshold. For example, in at least some embodiments, the method 200 can comprise using the first threshold and omitting the second threshold, or vice versa. Similarly, in at least some embodiments, the method 200 can comprise using additional thresholds (e.g., $n^{th}$ thresholds, 3, 4, 5, 6, . . . ). Additionally, in at least some embodiments, the method 200 can comprise using a reverse current for at least one threshold (e.g., a first threshold), a reverse voltage can be used for at least one other threshold (e.g., a second threshold), and a combination of reverse current and reverse voltage can be used for yet another threshold (e.g., a third threshold).

While the foregoing is directed to embodiments of the present disclosure, other and further embodiments of the disclosure may be devised without departing from the basic scope thereof.

The invention claimed is:

1. A method for processing a substrate, comprising:
    supplying pulsed DC power to a target disposed in a processing volume of a processing chamber for depositing sputter material onto a substrate;
    in response to a reverse current being equal to or greater than a first threshold during a first time frame within a pulse off time, generating a first pulsed DC power shutdown response to stop supplying power to the target; and
    in response to the reverse current being equal to or greater than a second threshold during a second time frame within the pulse off time, generating a second pulsed DC power shutdown response to stop supplying power to the target, wherein the first threshold is different from the second threshold, and the first time frame is different from the second time frame.

2. The method of claim 1, wherein the processing chamber is a physical vapor deposition chamber.

3. The method of claim 1, wherein the first time frame within the pulse off time is based on a duration for triggering the first pulsed DC power shutdown response and the second time frame within the pulse off time is based on a duration for triggering the second pulsed DC power shutdown response, and
    wherein the duration for triggering the first pulsed DC power shutdown response and the second pulsed DC power shutdown response is about 0 to a duration of a reverse pulse.

4. The method of claim 3, wherein the duration of the reverse pulse is about 1 µs.

5. The method of claim 1, wherein the first threshold corresponds to an arc occurrence that occurs during a pulse-on time.

6. The method of claim 1, wherein the first threshold detects arcs that do not meet criteria of at least one of voltage, current, or a differential of voltage or current.

7. The method of claim 1, wherein the second threshold corresponds to current excursions during the second time frame within the pulse off time.

8. The method of claim 1, wherein the substrate has a node size of 7 nm or less.

9. A non-transitory computer readable storage medium having stored thereon instructions that when executed by a processor performs a method for processing a substrate, comprising:
  supplying pulsed DC power to a target disposed in a processing volume of a processing chamber for depositing sputter material onto a substrate;
  in response to a reverse current being equal to or greater than a first threshold during a first time frame within a pulse off time, generating a first pulsed DC power shutdown response to stop supplying power to the target; and
  in response to the reverse current being equal to or greater than a second threshold during a second time frame within the pulse off time, generating a second pulsed DC power shutdown response to stop supplying power to the target, wherein the first threshold is different from the second threshold, and the first time frame is different from the second time frame.

10. The non-transitory computer readable storage medium of claim 9, wherein the processing chamber is a physical vapor deposition chamber.

11. The non-transitory computer readable storage medium of claim 9, wherein the first time frame within the pulse off time is based on a duration for triggering the first pulsed DC power shutdown response and the second time frame within the pulse off time is based on a duration for triggering the second pulsed DC power shutdown response, and
  wherein the duration for triggering the first pulsed DC power shutdown response and the second pulsed DC power shutdown response is about 0 to a duration of a reverse pulse.

12. The non-transitory computer readable storage medium of claim 11, wherein the duration of the reverse pulse is about 1 µs.

13. The non-transitory computer readable storage medium of claim 9, wherein the first threshold corresponds to an arc occurrence that occurs during a pulse-on time.

14. The non-transitory computer readable storage medium of claim 9, wherein the first threshold detects arcs that do not meet criteria of at least one of voltage, current, or a differential of voltage or current.

15. The non-transitory computer readable storage medium of claim 9, wherein the second threshold corresponds to current excursions during the second time frame within the pulse off time.

16. The non-transitory computer readable storage medium of claim 9, wherein the substrate has a node size of 7 nm or less.

17. A system, comprising:
  a substrate processing chamber;
  a pulsed DC power source;
  a sensor configured to measure a reverse current during operation; and
  controller configured to:
  receive data from the sensor;
  supply pulsed DC power to a target when disposed in a processing volume of the substrate processing chamber for depositing sputter material onto a substrate;
  in response to the reverse current being equal to or greater than a first threshold during a first time frame within a pulse off time, generate a first pulsed DC power shutdown response to stop supplying power to the target; and
  in response to the reverse current being equal to or greater than a second threshold during a second time frame within the pulse off time, generate a second pulsed DC power shutdown response to stop supplying power to the target, wherein the first threshold is different from the second threshold, and the first time frame is different from the second time frame.

18. The system of claim 17, wherein the substrate processing chamber is a physical vapor deposition chamber.

19. The system of claim 17, wherein the first time frame within the pulse off time is based on a duration for triggering the first pulsed DC power shutdown response and the second time frame within the pulse off time is based on a duration for triggering the second pulsed DC power shutdown response, and
  wherein the duration for triggering the first pulsed DC power shutdown response and the second pulsed DC power shutdown response is about 0 to a duration of a reverse pulse.

20. The system of claim 19, wherein the duration of the reverse pulse is about 1 µs.

* * * * *